United States Patent [19]

Pontre

[11] 4,151,461

[45] Apr. 24, 1979

[54] TESTER OF DRY DIELECTRIC STRENGTH FOR INSULATED ELECTRIC CABLE

[75] Inventor: Gilbert Pontre, Montmorency, France

[73] Assignee: CEFILAC, Paris, France

[21] Appl. No.: 869,583

[22] Filed: Jan. 16, 1978

[30] Foreign Application Priority Data

Jan. 21, 1977 [FR] France .................................. 77 02673

[51] Int. Cl.² ............................................. G01R 31/16
[52] U.S. Cl. ............................................. 324/54
[58] Field of Search ..................................... 324/54, 52

[56] References Cited

U.S. PATENT DOCUMENTS

| | | | |
|---|---|---|---|
| 2,386,127 | 10/1945 | Longfellow | 324/54 |
| 3,096,478 | 7/1963 | Brown | 324/54 |
| 3,263,165 | 7/1966 | Eigen | 324/54 |
| 3,321,703 | 5/1967 | Tyszewicz | 324/54 |
| 3,418,570 | 12/1968 | Clinton | 324/54 |

FOREIGN PATENT DOCUMENTS

509758 2/1955 Canada ..................................... 324/54

Primary Examiner—Gerard R. Strecker
Attorney, Agent, or Firm—McDougall, Hersh & Scott

[57] ABSTRACT

The invention relates to a tester of dry dielectric strength of the insulating sheath of an electric cable comprising a source of high alternating voltage applied between the core of the cable connected to ground and the external surface of the sheath, in which electrical contact with the sheath is provided only by means of a tube surrounding the cable and filled with an ionized atmosphere, the tension required for ionization being supplied by a generator which is independent of the measuring circuit.

4 Claims, 2 Drawing Figures

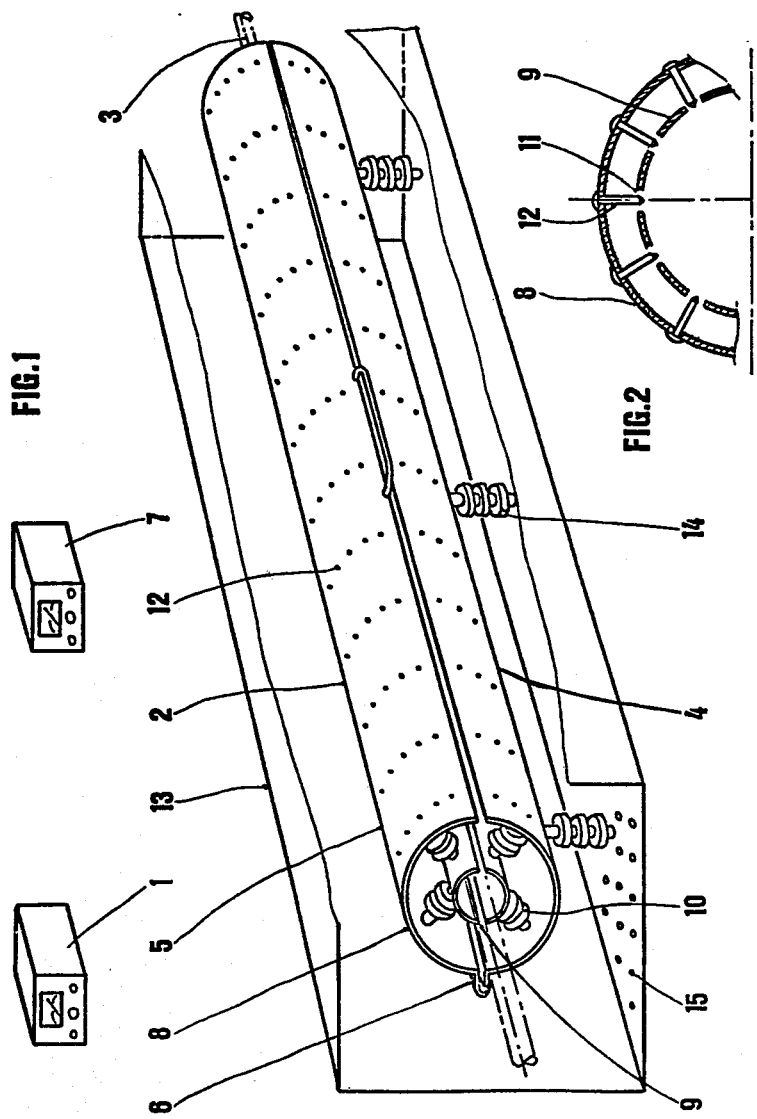

TESTER OF DRY DIELECTRIC STRENGTH FOR INSULATED ELECTRIC CABLE

The present invention relates to a tester of dry dielectric strength intended for automatically and continuously detecting faults in the insulating sheath of an electric cable.

Various devices already exist for electrically detecting faults in the insulation of cables either when leaving the production line or on a rewinding line. These devices comprise a high voltage generator consisting of a transformer emitting an alternating voltage of between 3 and 50 kV. This voltage is applied between ground to which the core of the cable is connected and the sheath of the traveling cable by a suitable means of contact. Any fault in the insulating sheath is indicated by a variation in the strength of the current in the cable known as "fault current", allowing faults to be detected, counted and, if necessary, an alarm to be triggered.

The contact between the voltage generator and the surface of the sheath of the cable may be ensured by various means. Concurrent metallic springs which expand to allow the cable to pass, or metallic brushes resting on the sheath mounted on a crown which is concentric to the cable and animated by a rotational movement, are used for large diameter cables. For cables of smaller diameter, the contact is ensured by strings of metallic beads forming a curtain traversed by the cable as it advances.

These apparatus are all based on the principle of frictional contact which has a considerable number of disadvantages. The contact with the external surface of the sheath is not always perfect so that certain defects are not detected. These devices are hardly versatile and can only be used within a narrow range of diameters. They do not allow for very high running speeds, whereas manufacture on modern production lines, as for telephone cables, for example, takes place at higher and higher speeds. They are poorly adapted to certain types of materials used for sheaths, such as chemically cross-linked polyethylene (CCP). Finally, the metal parts have to be changed fairly frequently.

It has been suggested that these apparatus be improved by applying the voltage to the sheath via a tube having its atmosphere ionized by the voltage emitted by the tester, but this tube comprised an internal metallic bead contact and the disadvantages caused by friction could not be overcome, particularly at high speed.

The object of the present invention is to allow the sheath of an insulated cable to be checked without friction by means of a compact and versatile device which is able to operate within a very wide range of diameters and speeds, which is suitable for all types of sheathing, and which requires hardly any maintenance.

These and other objects of this invention will hereinafter appear and, for purposes of illustration but not of limitation, an embodiment of the invention is shown in the accompanying drawing in which:

FIG. 1 is a perspective diagramatic view of a tester embodying the features of this invention, and FIG. 2 is a detailed view of the mounting of the barb on the wall of the tube.

According to the invention, the tester of dry dielectric strength of the insulating sheath of a continuously traveling electric cable which contains a source of high alternating voltage applied between the core of the cable connected to ground and the external surface of the sheath and a device for measuring the fault current, is characterized in that the electrical contact with the sheath is ensured only by a tube surrounding the cable and filled with an ionized atmosphere, the voltage required for ionizing the atmosphere of the tube being supplied by a generator which is independent of the measuring circuit.

In a particular embodiment of the invention, the tube surrounding the cable consists of two cylindrical conducting walls which are coaxial to the cable and electrically insulated from each other, between which the ionizing voltage is applied, the external wall being provided with barbs extending radially towards the internal wall and passing through the internal wall by means of orifices pierced therein so as to ionize the space between the cable and the internal wall.

The tester, according to the invention, advantageously comprises a regulating device for varying the frequency of the voltage applied to the sheath as a function of the running speed of the cable so as to prevent needless fatigue of the sheath.

It may also comprise a device for regulating the fault current which allows the particular conditions of use to be taken into consideration, for example, losses caused by wet cables, and an electro-magnetic counter which adds up the faults so as to maintain the display even if the supply unexpectedly disappears.

The tester is supplied with monophase alternating current under a voltage of 220 to 380 V at a frequency of 50 Hz. It consists of a high voltage generator 1 at a power of 150 VA in a steady state and 800 VA at a peak for supplying an output voltage which may be adjusted by potentiometer between 0.5 and 20 kV. The frequency of this voltage may also be adjusted between 100 and 600 Hz. This possibility of adjustment is important for preventing needless and irreversible fatigue of the insulating sheath when the operating conditions compel the running speed of the cable to be reduced considerably. Adjustment may be carried out manually or automatically if the running speed is frequently varied. The test voltage is applied to a conducting tube 2 composed, for example, of brass, surrounding the cable 3 to be checked and having a sufficiently large internal diameter to allow the rough outgrowths of the cable, such as are caused by the connections or knots, to pass over the largest useful diameter.

The tube may contain a longitudinal slot for introducing the cable laterally, or, on the other hand, may be closed and the cable introduced through the end. As shown in FIG. 1, it may also be composed of two half-cylinders 4 and 5 linked on a longitudinal hinge 6 so as to simplify introduction of the cable.

An ionized atmosphere is obtained inside the tube by applying a fixed voltage of between 2500 and 3000 V, produced by an autonomous generator 7 which is different from the high voltage generator of the measuring circuit. It is advantageous for this ionizing voltage to be applied between two conducting elements. For this purpose, the tube is composed of a double brass wall, for example, an external cylindrical wall 8 and an internal cylindrical wall 9 which are coaxial to the cable. These two walls are fixed together by radial insulating supports 10. The ionizing voltage is applied between these two conducting walls and ionizes the annular space between them.

In order to ionize the space between the cable and the internal wall, this internal wall is pierced with orifices 11. Furthermore, a number of barbs 12, fixed on the external wall, point radially towards the internal wall 9 and pass therethrough in the orifices, to allow the ionization to be directed inside the internal wall as a result of the point effect. The barbs end flush with the internal wall on the side of the cable so as to maintain the useful internal diameter of the tube. The barbs are fixed to the external wall by any means for providing a good electrical contact, for example welding or brazing. Of course, contact must be avoided between the internal wall and the barb, and the orifices 11 must therefore be sufficiently large.

As an example, brass tubes having a length of 500 mm and a wall thickness of 1.5 mm and diameters of 50 mm and 70 mm respectively, were provided with barbs of between 1 and 2 mm in diameter arranged regularly in 19 planes perpendicular to the axis of the cylindrical walls, each plane containing 8 barbs anchored regularly along the circumference at the intersection of the plane and the external wall. The orifices 11 in the internal wall 9, through the center of which the ends of the barbs pass, are about 5 mm in diameter.

The tube is mounted on a frame 13 and fixed to the frame by insulators 14. The lower part of the frame is pierced with holes 15 for evacuating the water emanating from insufficient wiping of the cables after extrusion or from an external supply and seeping from the cable during the monitoring operation.

The apparatus also comprises a device for adjusting the fault current, for example by potentiometer, between 5 and 30 mA. This adjustment allows variations in this current, caused by particular conditions of use, to be taken into consideration. In fact, the cable may be wet either because the reels have been stored outside or because of insufficient cleaning upon leaving the cooling tank of the extrusion line.

Finally, the apparatus contains devices for treating the fault once this has been detected, for example a visual or sound signal with means for shutting down or slowing down the running speed, and an electromagnetic counter for adding up the faults and placing them in a memory, thus storing the display even if the electrical supply unexpectedly disappears, for example as a result of a breakdown.

A tester of this type allows the insulation of cables to be checked within a range of diameters from 0.2 to 30 mm, with rough projection of up to 50 mm, and at running speeds of up to between 1500 to 2000 m per min. whatever the nature of the insulator (rubber, PVC, CCP etc.).

I claim:

1. A tester of dry dielectric strength of the insulating sheath of a continuously traveling electric cable which comprises:
   (a) a source of high alternating voltage applied between the grounded core of the cable and the external surface of the sheath,
   (b) means for measuring fault current in said cable, said means comprising a tube surrounding the cable and containing an ionized atmosphere for maintaining electrical contact with the sheath, and a generator which is independent of the measuring circuit supplying the voltage for ionization, said tube consisting of two cylindrical conducting walls, which are coaxial to the cable and electrically insulated from each other, between which the ionization voltage is applied, barbs secured to the outer wall of said conducting walls and extending radially inwardly passing through passages in said internal wall so as to allow the space between the cable and the internal wall to be ionized.

2. A tester as claimed in claim 1 which further includes a means for adjusting the frequency of the voltage applied.

3. A tester as claimed in claim 1 which further includes a means for adjusting the high alternating voltage source.

4. A tester as claimed in claim 1 which comprises an electro-magnetic counter for adding up the faults.

* * * * *